United States Patent
Hu et al.

(10) Patent No.: US 8,222,956 B2
(45) Date of Patent: Jul. 17, 2012

(54) AMPLIFYING DEVICE AND SIGNAL PROCESSING METHOD BASED ON AMPLIFYING DEVICE

(75) Inventors: Xinrong Hu, Shenzhen (CN); Yuan Wei, Shenzhen (CN); Fan Yang, Shenzhen (CN); Linghai Zeng, Shenzhen (CN); Chen Wang, Shenzhen (CN); Ling Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 44 days.

(21) Appl. No.: 13/027,959

(22) Filed: Feb. 15, 2011

(65) Prior Publication Data

US 2011/0204973 A1   Aug. 25, 2011

(30) Foreign Application Priority Data

Feb. 24, 2010   (CN) .......................... 2010 1 0113264

(51) Int. Cl.
*H03F 3/68* (2006.01)

(52) U.S. Cl. .................... 330/124 R; 330/295; 455/132; 455/127.3

(58) Field of Classification Search ............. 330/124 R, 330/295; 455/132, 127.3
See application file for complete search history.

(56) References Cited

U.S. PATENT DOCUMENTS

| 4,598,252 | A  | * | 7/1986  | Andricos ......................... 330/51 |
| 5,093,667 | A  | * | 3/1992  | Andricos ....................... 342/372 |
| 5,909,643 | A  | * | 6/1999  | Aihara ........................ 455/127.3 |
| 6,255,903 | B1 | * | 7/2001  | Leffel .............................. 330/51 |
| 6,271,722 | B1 | * | 8/2001  | Ballantyne ...................... 330/51 |
| 6,272,336 | B1 | * | 8/2001  | Appel et al. ................... 455/423 |
| 7,119,621 | B2 | * | 10/2006 | Chen et al. ..................... 330/295 |
| 7,365,664 | B2 | * | 4/2008  | Caduff et al. ................. 341/139 |

* cited by examiner

*Primary Examiner* — Patricia Nguyen

(57) ABSTRACT

An amplifying device and a signal processing method based on an amplifying device are provided, capable of reducing performance requirements of modules and reducing design difficulty of the modules. The amplifying device includes at least one amplifying module, including two receiving paths, in which a first receiving path is configured to attenuate and amplify an input signal after the input signal is pre-amplified, and a second receiving path is configured to amplify the input signal when the input signal is not pre-amplified. The signal processing method based on the amplifying device is further provided. The amplifying device and the signal processing method may be applied in a communication network system.

14 Claims, 6 Drawing Sheets

AMPLIFYING DEVICE AND SIGNAL PROCESSING METHOD BASED ON AMPLIFYING DEVICE

CROSS-REFERENCE TO RELATED APPLICATION

This application claims priority to Chinese Patent Application No. 201010113264.X, filed on Feb. 24, 2010, which is hereby incorporated by reference in its entirety.

TECHNICAL FIELD

The present disclosure relates to the field of communications technologies, and in particular, to an amplifying device and a signal processing method based on an amplifying device.

BACKGROUND

The receiver of the base station needs to support various application scenarios simultaneously, for example, support Tower Amplification (TA) application, application of inter-link connection, and main-diversity dual-path application. In order to support the applications simultaneously, a front end of the receiver needs to include modules supporting various applications, and the modules need to match one another, so that the number of the modules on the front end of the receiver is large, and structure of the receiver is complex.

TA in the TA application generally refers to a Low Noise Amplifier (LNA) installed on top of the tower which resides closely behind a receiving antenna. The TA is capable of amplifying a received signal by approximately 12 Decibels (dB) before the received signal enters the receiver, so as to enhance quality of uplink signal, improve the reliability and the voice quality of calls, and expand the cell coverage area. That is, the signals entering the receiver have different signal ranges according to whether the TA exists or according to different gains of the TA. In the prior art, the conventional dual-path receiver generally adopts link architecture as shown in FIG. 1, which adopts a mode of combining separated devices to implement gain control and satisfy interlink connection requirements. As shown in FIG. 1, in order to support the TA application, a Digital Step Attenuator (DSA) is disposed at a main path, at a diversity path, and on the most front end of an input port of the receiver each. Because the signals entering the receiver have the different signal ranges according to whether the TA exists or according to different gains of the TA, the following LNA cannot bear such a large range of signal, a DSA needs to be added at the most pre-stage of the input port. The DSA correspondingly performs attenuation according to whether the TA exists in the front end of the receiver or according to the gain of the TA, so that the voltage of the signals that reach the LNA at the post-stage is maintained at a fixed range, so as to ensure the normal operation of the entire receiver. In order to support interlink connection, the main path of the receiver achieves a function of dividing a path of signal into two paths of signals for output through a power divider (PD), while the diversity path achieves a function of combining the paths of signals into one path of signal through a switch (SW). FIG. 2 is a schematic circuit diagram of a main path of a receiver. As shown in FIG. 2, after the signal enters the main path, the main path implements the adjustment of input voltage under different configurations through a DSA, and output two paths of signals through a PD after an LNA, and an amplifier (AMP) after the PD is used to provide gains from a radio frequency input port to a radio frequency output port 1.

During the implementation of various applications by the receiver, the inventor finds that the prior art at least has the following problems. Insertion loss of the DSA is large, which directly deteriorates noise coefficients of modules on the front end of the receiver, and has great influences on the gain coefficients of the circuit. Moreover, the influence of the insertion loss of the PD and SW on the post-stage of the LNA cannot be ignored. Therefore, in order to ensure a noise-to-signal ratio of the entire receiver, the LNA should have very low noise, high gain, and good linearity. Thus, in order to ensure performance of the application modules, matching of the modules, and the performance of the receiver, the level of the noise, the gain, and the linearity of the modules are high, increasing the design difficulty.

SUMMARY

The present disclosure is mainly directed to an amplifying device, adopting the following technical solution.

An amplifying device is provided, which includes at least one amplifying module. The amplifying module includes two receiving paths, in which a first receiving path is configured to attenuate and amplify an input signal after the input signal is pre-amplified; and a second receiving path is configured to amplify the input signal when the input signal is not pre-amplified.

By adopting the technical solution, the amplifying device according to the present disclosure is capable of selecting different receiving paths for voltage adjustment according to requirements of the input signal, so the influences caused by insertion loss of the DSA on noise coefficients and gains is reduced, thereby reducing the performance requirements of the modules, and reducing the design difficulty.

The present disclosure is further directed to a signal processing method based on an amplifying device, adopting the following technical solution.

A signal processing method based on an amplifying device is provided. The method includes:

acquiring a signal; and after the signal is pre-amplified, attenuating the signal, and then amplifying the signal; and when the signal is not pre-amplified, amplifying the signal without being attenuated.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION

The technical solution of the present disclosure is hereinafter described in detail with reference to the accompanying drawings. It is evident that the embodiments are only some exemplary embodiments of the present disclosure, and the present disclosure is not limited to such embodiments. Other embodiments that persons skilled in the art obtain based on embodiments of the present disclosure are also all within the protection scope of the present disclosure.

The present disclosure provides an amplifying device and a signal processing method based on the amplifying device, capable of reducing performance requirements of modules of the amplifying device, and reducing design difficulty of the modules.

Figure 1:
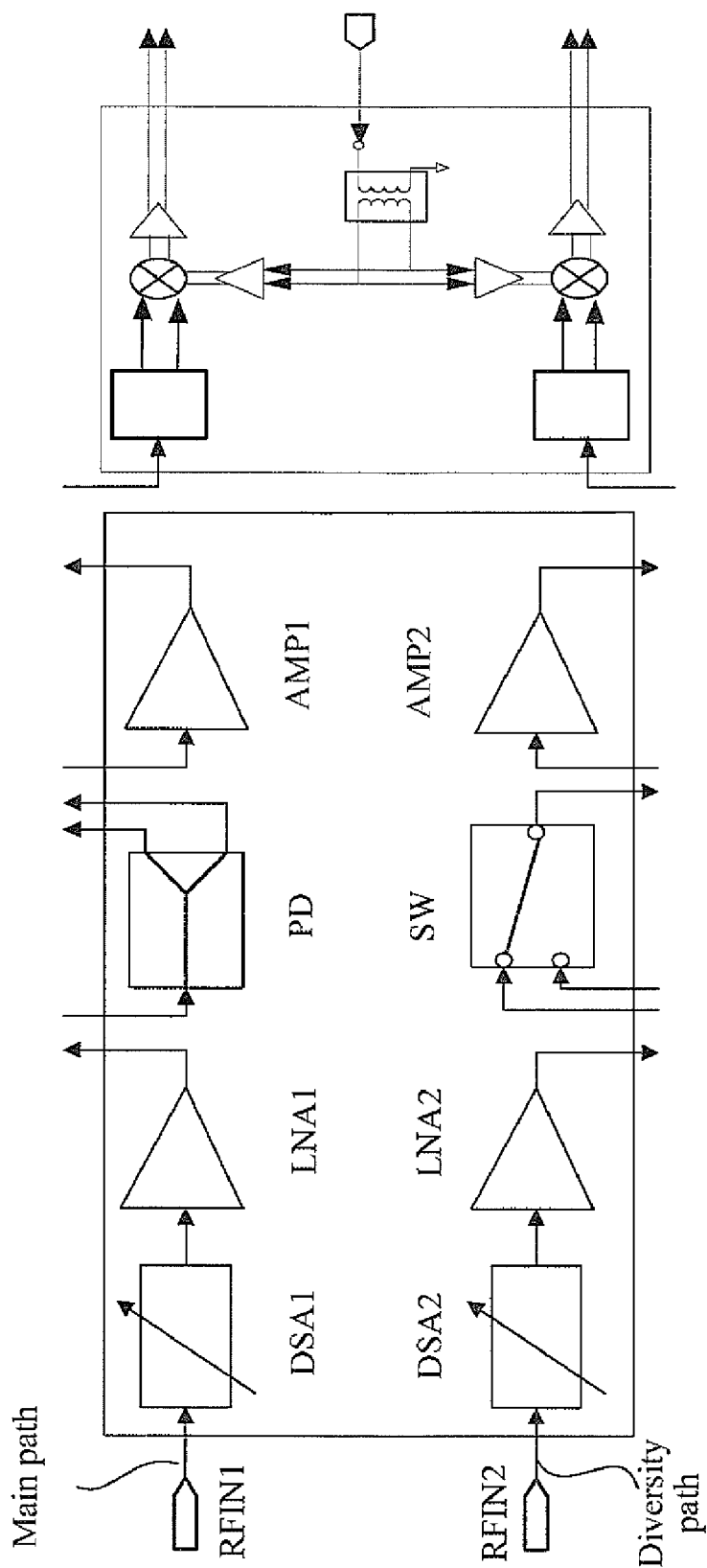
FIG. 1 is system architecture diagram of a dual-path receiver in the prior art.
Figure 2:
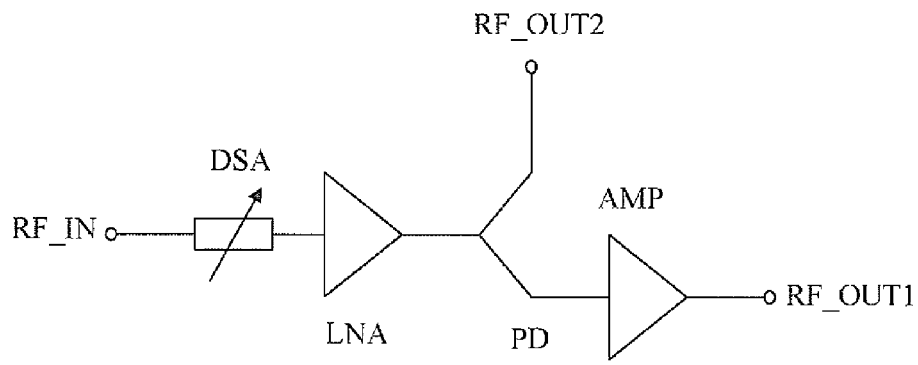
FIG. 2 is a schematic circuit diagram of a main path of the dual-path receiver in the prior art.
Figure 3:
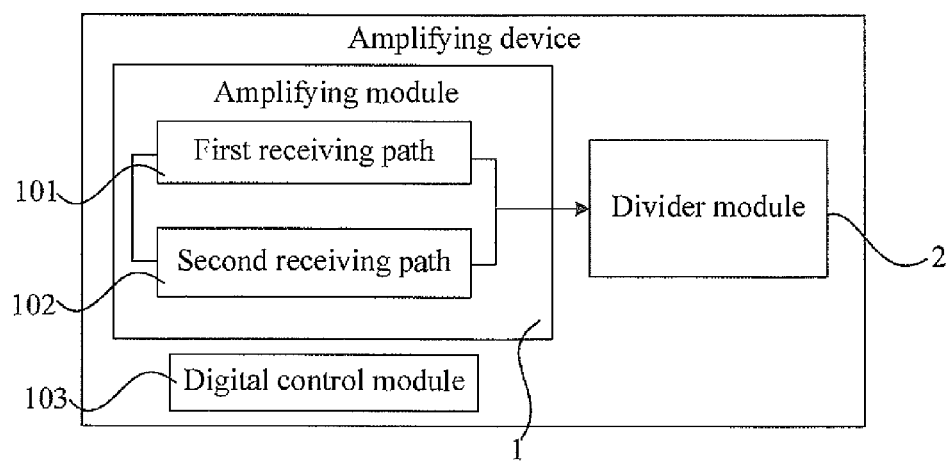
FIG. 3 is a structural block diagram of an amplifying device according to the present disclosure.

As shown in FIG. 3, the amplifying device according to the present disclosure includes at least one amplifying module 1, in which the amplifying module 1 includes two receiving paths, that is, a first receiving path 101 and a second receiving path 102.

The first receiving path 101 is configured to attenuate and amplify an input signal after the input signal is pre-amplified;

The second receiving path 102 is configured to amplify the input signal when the input signal is not pre-amplified.

Furthermore, the amplifying device according to the present disclosure further includes at least one divider module 2, coupled with the at least one amplifying module 1, and configured to perform interlink connection on the input signal processed by the amplifying module 1.

Furthermore, the amplifying device according to the present disclosure further includes a digital control module 103, coupled with the first receiving path 101 and the second receiving path 102 each, configured to control the two receiving paths to be opened or closed, and further configured to provide digital signals for controlling operations of the modules according to operation requirements and settings of the amplifying device.

Furthermore, the amplifying module 1, the divider module 2, and the digital control module 103 may be integrated in a semiconductor chip. As compared with a packaging form of separated devices, the integration form not only reduces costs, but also improves reliability of the device.

In order to make persons in the art understand the technical solutions of the present disclosure better, the amplifying device according to the present disclosure is described in detail with reference to the following embodiments and accompanying drawings. It should be noted that, the embodiments are only for illustrating the present disclosure, but not for limiting the scope of the present invention.

Embodiment 1

Figure 4:
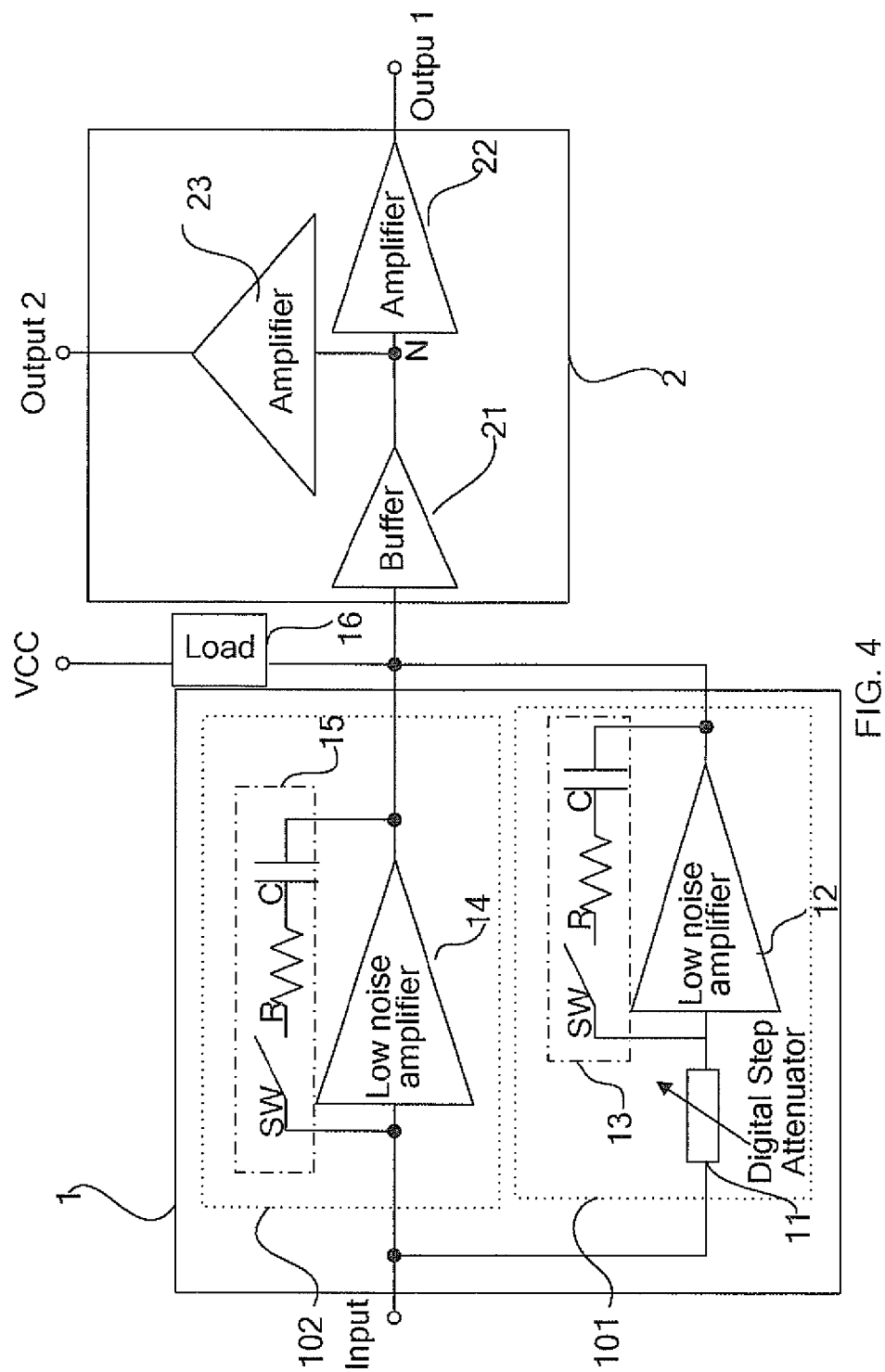
FIG. 4 is a schematic circuit diagram of Embodiment 1 of the present disclosure.

An amplifying device according to this embodiment is disposed in a receiver, in which the receiver may include, but is not limited to, a tower receiver for communication. As shown in FIG. 4, the amplifying device includes an amplifying module 1, in which the amplifying module 1 includes two receiving paths, that is, a first receiving path 101 and a second receiving path 102. The first receiving path 101 is configured to attenuate and amplify an input signal after the input signal is pre-amplified; and the second receiving path 102 is configured to amplify the input signal when the input signal is not pre-amplified.

Furthermore, the amplifying device according to this embodiment further includes a divider module 2, coupled with the amplifying module 1, and configured to perform interlink connection on the input signal processed by the amplifying module 1.

It should be noted that, the amplifying device according to this embodiment further includes a digital control module 103, coupled with the first receiving path 101 and the second receiving path 102 each, configured to control the two receiving paths to be opened or closed, and may further configured to provide digital signals for controlling operations of the modules. FIG. 4 only shows a circuit for implementing basic functions of the amplifying module 1 and the divider module 2 according to this embodiment, but actually the amplifying device according to this embodiment further includes an auxiliary circuit module and other structures, for example, the digital control module 103, which is not shown.

As shown in FIG. 4, the first receiving path 101 and the second receiving path 102 are connected to each other in parallel. The first receiving path 101 includes a DSA 11 and a first LNA 12 serially connected to the DSA 11, in which an output port of the DSA 11 is coupled with an input port of the first LNA 12. The second receiving path 102 includes a second LNA 14. An input port of the DSA 11 is coupled with an input port of the second LNA 14, to serve as an input port of the amplifying module 1, and an output port of the first LNA 12 is coupled with an output port of the second LNA 14, to serve as an output port of the amplifying module 1.

Furthermore, the LNA 12 is connected to a switch controlled resistance-capacitance (RC) feedback circuit 13 in parallel; and the second LNA 14 is connected to a switch controlled RC feedback circuit 15 in parallel, too. Because the first receiving path 101 and the second receiving path 102 share the same input and output, the switch controlled RC feedback circuits are adopted to perform input and output matching, and the switch (SW) is configured to prevent an input signal from being leaked to the output port through the RC feedback circuit when the paths are closed. It should be noted that, in this embodiment, the RC feedback circuits are adopted to perform the input and output matching, but the present disclosure is not limited thereto, and other input and output matching modes may also be adopted according to actual situations, which is not limited herein.

Moreover, the output nodes of the second LNA 14 and the first LNA 12 share one load 16. With the load 16 shared by the two paths, a considerable large area of the chip is saved.

In application, according to whether TA exists on a front end, that is, whether input voltage adjustment requirements exist, a method of dividing input signal into two signals is selected to implement input voltage adjustment function and reduce performance requirements of modules. When no TA exists on the front end of the receiver, the digital control module 103 controls the second receiving path 102 in which the second LNA 14 is located to be opened, and the first receiving path 101 in which the first LNA 12 is located to be closed, so that the signal passes through the second LNA 14 and enters a post-stage circuit. Because no DSA exists before the second LNA 14, the noise requirement on the second LNA 14 is reduced; when the TA exists on the front end of the amplifying device, the digital control module 103 controls the second receiving path 102 in which the second LNA 14 is located to be closed, and the first receiving path 101 in which the first LNA 12 is located to be opened, attenuation gears of the DSA 11 are adjusted to match TA configuration of different gains.

Furthermore, the divider module 2 includes a first AMP 22 and a second AMP 23, each of which being coupled with the output port of the pre-stage amplifying module 1, and configured to perform signal interlink connection. Additionally, the divider module 2 further includes a buffer 21, in which an input port of the buffer 21 is coupled with the output port of the amplifying module 1, and an output port of the buffer 21 is coupled with the input port of the first AMP 22 and the input port of the second AMP 23 each, and the buffer 21 is configured to isolate impedance. According to the requirement of interlink connection, the divider module 2 according to this embodiment adopts the first AMP 22 and the second AMP 23 to implement the function of dividing a signal into two signals for output, thereby preventing the insertion loss of PD introduced in the prior art, and reducing high requirements of the gain and linearity of the first LNA 12 and the second LNA 14. In order to save power consumption, when interconnecting output is not required, the second AMP 23 needs to be controlled by a digital signal to be opened or closed, which means that the impedance of the pre-stage module at a node N is variable. In order to ensure the performance of the pre-stage module, the buffer 21 with the function of isolating the impedance may be inserted between the output port on the pre-stage and the two AMPs. Thus, for the LNA on the pre-stage, no matter the following AMP is in on status or off status, the variation of the node impedance from the buffer 21 is not large, thereby ensuring that the gain fluctuation of the entire link is within the scope required under different configurations. Definitely, the signal interlink connection function of the divider module 2 according to this embodiment may also be implemented by adopting a PD or other means. Some insertion losses may be introduced when adopting PD, but can still achieve the purpose of signal interlink connection. The divider module 2 according to this embodiment is configured to implement the interlink connection of dividing one signal into two, and it should be understood that, the divider module 2 can also implement the interlink connection function that combines the two signals into one signal, and this embodiment does not make limitations thereon.

Currently, the GaAs technology (that is, GaAs integrated circuit manufacturing technology) is generally adopted to implement the amplifying module in the tower receiver in the industry, but the GaAs technology has the disadvantages that the yield of the product is low, the electrostatic discharge protection performance is poor, the costs of the product are high, and special processing is needed during the transport and processing the GaAs products. At the same time, the digital circuit can not be implemented by GaAs technology, and in order to implement digital control function, an additional packaged digital control chip is needed. Furthermore, the modules according to this embodiment are implemented by adopting the SiGe technology (SiGe integrated circuit manufacturing technology), so that the disadvantages of low yield, high costs, and poor electrostatic discharge protection performance of the GaAs p technology can be overcome; meanwhile, the SiGe technology can be used for implementing the digital circuit. Thus, the entire device may be integrated in one semiconductor chip, so that the costs are reduced, and the reliability is improved.

The amplifying device according to this embodiment is capable of achieving the input signal voltage adjustment and supporting the function of interlink connection, thereby significantly reducing the performance requirements of the system modules.

Embodiment 2

Figure 5:
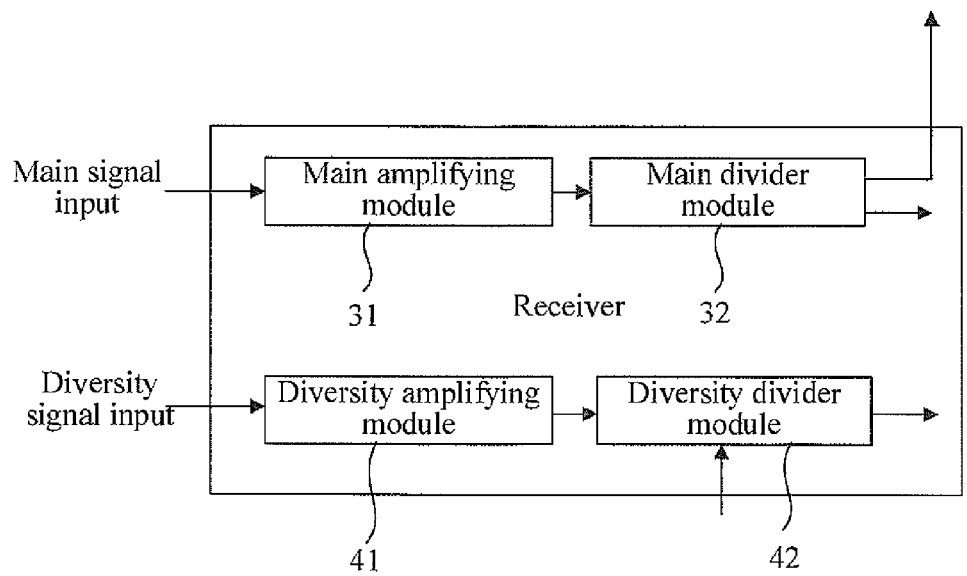
FIG. 5 is a structural block diagram of Embodiment 2 of the present disclosure.
Figure 6:
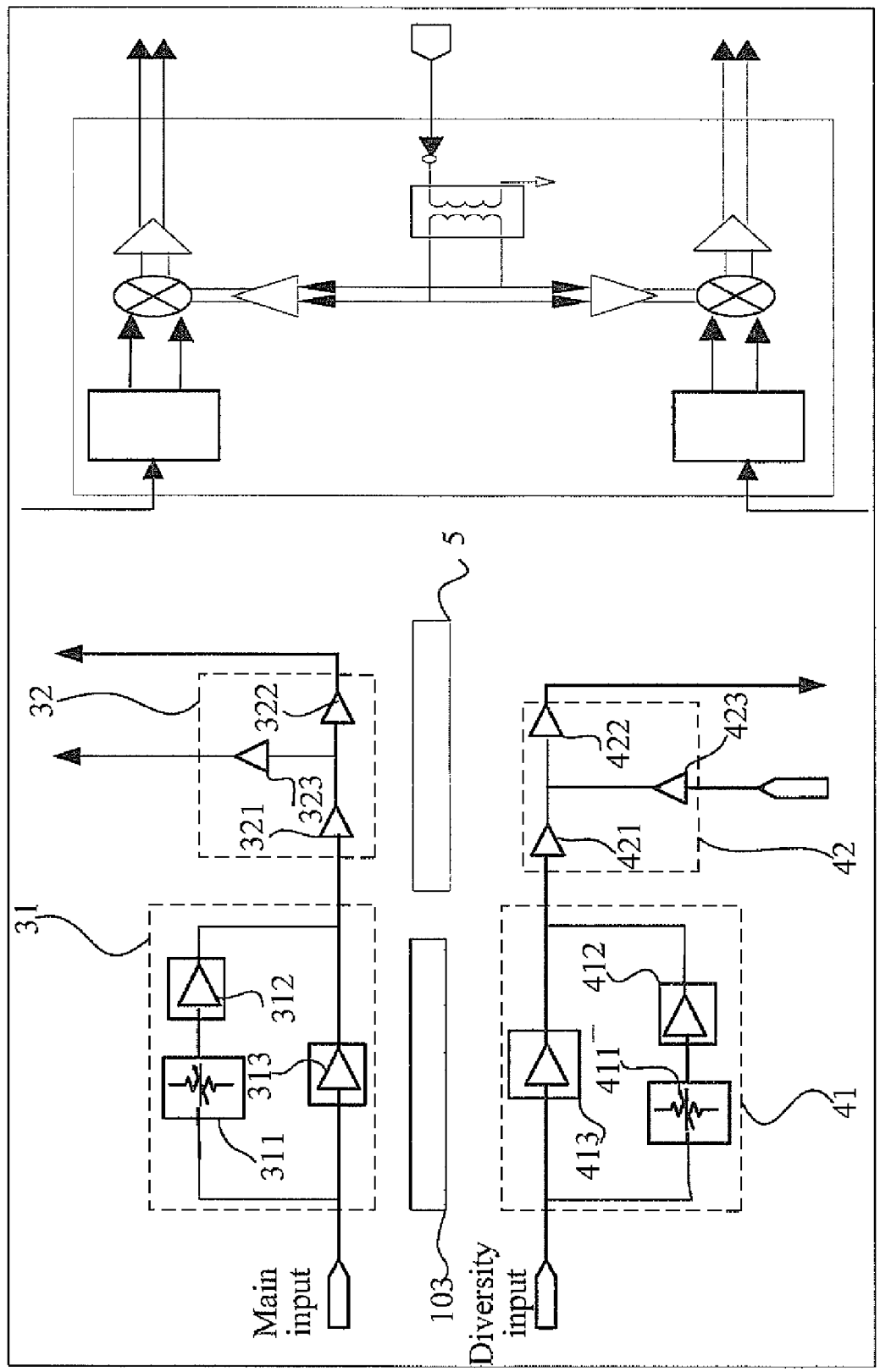
FIG. 6 is a system architecture diagram of Embodiment 2 of the present disclosure.

An amplifying device according to this embodiment is a main-diversity dual-path receiver. Referring to a structural block diagram as shown in FIG. 5 and a system architecture diagram as shown in FIG. 6, the receiver according to this embodiment includes a main amplifying module 31, and a main divider module 32 coupled with the main amplifying module 311; and further includes a diversity amplifying module 41, and a diversity divider module 42 coupled with the diversity amplifying module 41.

Both the main amplifying module 31 and the diversity amplifying module 41 adopt a functional structure of the amplifying module 1 according to Embodiment 1, and include two receiving paths. The two receiving paths of the main amplifying module 31 are connected to each other in parallel, in which one receiving path includes a DSA 311 and a third LNA 312, and is configured to attenuate and amplify an input signal after the input signal is pre-amplified; and the other path includes a fourth LNA 313, and is configured to amplify the input signal when the input signal is not pre-amplified. The two receiving paths of the diversity amplifying module 41 are connected to each other in parallel, in which one receiving path includes a DSA 411 and a fifth LNA 412, and is configured to attenuate and amplify an input signal after the input signal is pre-amplified; and the other receiving path includes a sixth LNA 413, and is configured to amplify the input signal when the input signal is not pre-amplified. The functional structures of the main amplifying module 31 and the diversity amplifying module 41 are as described in Embodiment 1, and will not be repeated herein. It should be noted that, FIG. 6 is only a system architecture diagram of this embodiment, and does not represent the actual circuit. Thus, the amplifying device according to this embodiment is capable of selecting different paths to perform voltage adjustment according to whether a TA exists in the pre-stage, so as to reduce influences of insertion loss of the DSA on noise coefficients and gains, thereby reducing the performance requirements of the modules, and reducing the design difficulty.

The main divider module 32 adopts the structure of the divider module 2 in Embodiment 1, and includes a buffer 321, a third AMP 322, and a fourth AMP 323. An input port of the buffer 321 is coupled with an output port of the pre-stage amplifying module 31 of the divider module 32, and an output port of the buffer 321 is coupled with an input port of the third AMP 322 and an input port of the fourth AMP 323 each. The main divider module achieves the function of dividing one signal into two through the third AMP 322 and the fourth AMP 323, that is, sends a signal to the receiver and/or another receiver of the interlink connection. The main divider module 32 prevents the insertion loss of the PD, thereby further reducing the performance requirements of the pre-stage LNA. Definitely, the signal interlink connection function of the main divider module 32 according to this embodiment may also be achieved by adopting a PD or other device. Some insertion losses may be introduced when adopting a PD, but the purpose of signal interlink connection still can be achieved.

The diversity divider module 42 includes a fifth AMP 422 and a sixth AMP 423, configured to perform signal interlink connection. An input port of the fifth AMP 422 is coupled with an output port of the diversity amplifying module 41, and an output port of the sixth AMP 423 is coupled with the output port of the diversity amplifying module 41. Furthermore, the diversity divider module 42 further includes a buffer 421, configured to isolate impedance. The input port of the buffer 421 is coupled with an output port of the amplifying module 41 on the pre-stage of the diversity divider module 42, and the output port of the buffer 421 is coupled with the input port of the fifth AMP 422 and the output port of the sixth AMP 423 each. The diversity divider module 42 achieves the function of combining two signals into one through the fifth AMP 422 and the sixth AMP 423, to meet the interlink connection requirements, that is, receives a signal sent by the receiver or another receiver in interlink connection and sends the signal to a post-stage module. The diversity divider module 42 prevents the insertion loss of the SW introduced in the prior art, thereby further reducing the performance requirements of the pre-stage LNA. Definitely, the signal interlink connection function of the diversity divider module 42 according to this embodiment may also be implemented by adopting an SW or other means. Some insertion losses may be introduced when adopting an SW, but the purpose of signal interlink connection still can be achieved.

It should be noted that, in the main divider module and the diversity divider module, the effect of the buffer is the same as that of the buffer 21 in Embodiment 1, and will not be repeated herein.

Furthermore, the amplifying device according to this embodiment further includes a digital control module 103 and another auxiliary circuit 5. The digital control module 103 is configured to control the two receiving paths of the main and diversity amplifying modules to be opened or closed, and is further configured to provide digital signals for controlling operations of modules according to the system requirements and settings of the device.

Furthermore, the modules according to this embodiment may be implemented by adopting the SiGe technology, so that the disadvantages of low yield, high costs, and poor electrostatic discharge protection performance of the GaAs technology can be overcome. Therefore, the SiGe technology can be used for implementing the digital circuit. Thus, the entire device may be integrated in one semiconductor chip, so that the costs are reduced, and the reliability of the device is improved.

As compared with the prior art, the amplifying device according to this embodiment changes the system architecture of the amplifying device, and is capable of selecting different paths to perform voltage adjustment according to the requirement of the input signal, so as to reduce the influence of insertion loss of the DSA on noise coefficients and gains, thereby reducing the performance requirements of the modules, and reducing the design difficulty. Moreover, the front end of the amplifying device according to this embodiment may be implemented by adopting the SiGe technology, so that the disadvantages of low yield, high costs, and poor electrostatic discharge protection performance of the GaAs technology can be overcome. Moreover, the amplifying device may be implemented on a chip, so that the costs are reduced, and the reliability of the device is improved, as compared with the packaging solution of single package system of the separated devices.

Figure 7:
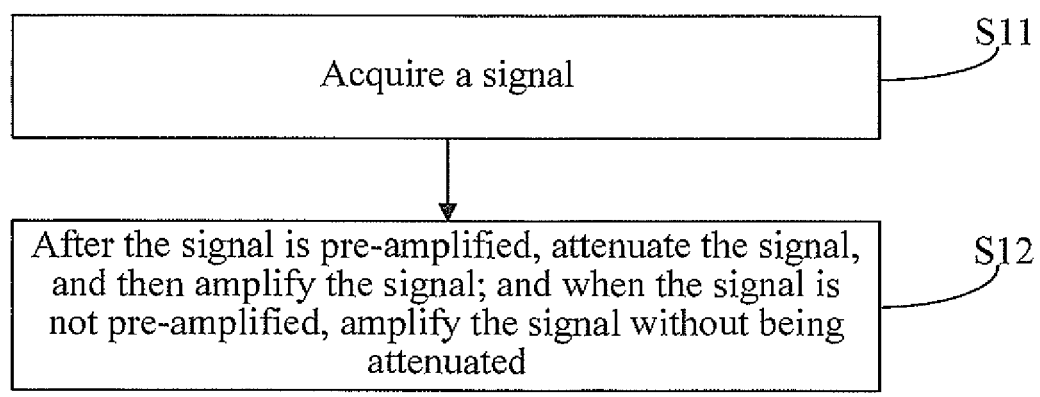
FIG. 7 is a flow chart of a signal processing method based on an amplifying device according to the present disclosure.

Accordingly, the present disclosure further provides a signal processing method based on an amplifying device, capable of reducing performance requirements of modules on a front end of the amplifying device, and reducing design difficulty of the modules. Referring to a flow chart as shown in FIG. 7, the signal processing method based on the amplifying device according to this embodiment includes the following steps:

Step S11: Acquire a signal.

Step S12: after the signal is pre-amplified, attenuate the signal, and then amplify the signal; and when the signal is not pre-amplified, amplify the signal without being attenuated.

Through the steps, the amplifying device implements the function of supporting the TA application, and is capable of selecting the voltage adjusting mode according to the requirements of the input signal, so as to reduce the influence of insertion loss of the DSA on performances, such as noise of the circuit, thereby reducing the performance requirements of the modules of the post-stage of the DSA, and reducing the design difficulty.

In order to support interlink connection application, after step S12, the signal processing method according to the present disclosure further includes dividing the amplified signal into two parts, which includes amplifying the signal into the two signals by two AMPs each.

Thus, by adopting the AMP, the insertion loss of the PD is prevented, so that the performance requirements on the pre-stage LNA are further reduced. Definitely, in this embodiment, a PD may be adopted to divide the signal into two signals, but some insertion loss may be introduced.

Persons of ordinary skill in the art should understand that all or a part of the steps of the method according to the embodiments of the present disclosure may be implemented by a program instructing relevant hardware. The program may be stored in a computer readable storage medium. When the program is run, the steps of the method according to the embodiments of the present disclosure are performed. The storage medium may be any medium that is capable of storing program codes, such as a ROM, a RAM, a magnetic disk, and an optical disk.

The above descriptions are merely several embodiments of the present disclosure, but not intended to limit the present disclosure. Various variations and modifications made by persons skilled in the art without departing from the spirit of the present disclosure fall within the scope of the present disclosure. Therefore, the protection scope of the present disclosure is subject to the appended claims.

What is claimed is:

1. An amplifying device, comprising:
   at least one amplifying module; and
   each of the at least one amplifying module comprises a first receiving path and a second receiving path;
   wherein the first receiving path is configured to attenuate and amplify a first input signal after the first input signal is pre-amplified; and
   the second receiving path is configured to amplify a second input signal when the second input signal is not pre-amplified.

2. The amplifying device according to claim 1, further comprising at least one divider, wherein each of the at least one divider is coupled with the each of the at least one amplifying module respectively, and configured to perform interlink connection on a signal output by the each of the at least one amplifying module.

3. The amplifying device according to claim 2, wherein a divider in the at least one divider comprises a first amplifier (AMP) and a second AMP, configured to perform signal interlink connection, and an input of the first AMP and an input of the second AMP are coupled with an output of an amplifying module in the at least one amplifying module.

4. The amplifying device according to claim 3, wherein the divider further comprises a buffer for isolating impedance, and an input of the buffer is coupled with the output of the amplifying module, and an output of the buffer is coupled with the input of the first AMP.

5. The amplifying device according to claim 2, wherein a divider in the at least one divider comprises a first AMP and a second AMP, configured to perform signal interlink connection, an input of the first AMP is coupled with an output of an amplifying module in the at least one amplifying module, and an output of the second AMP is coupled with the input of the first AMP.

6. The amplifying device according to claims, wherein the divider further comprises a buffer for isolating impedance, an input of the buffer is coupled with the output of the amplifying module, and an output of the buffer is coupled with the input of the first AMP.

7. The amplifying device according to claim 1, further comprising a digital controller, coupled with the first receiving path and the second receiving path, configured to:
   control the first receiving path to be opened and the second receiving path to be closed when the first input signal is pre-amplified, and
   control the second receiving path to be opened and the first receiving path to be closed when the second input signal is not pre-amplified.

8. The amplifying device according to claim 7, wherein the amplifying module, the divider, and the digital controller are integrated in a semiconductor chip.

9. The amplifying device according to claim 1, wherein
   the first receiving path comprises a Digital Step Attenuator (DSA) and a first Low Noise Amplifier (LNA);
   the second receiving path comprises a second LNA;
   an input of the DSA is coupled with an input of the second LNA;
   an output of the DSA is coupled with an input of the first LNA; and
   an output of the first LNA is coupled with an output of the second LNA.

10. The amplifying device according to claim 9, wherein
    the first LNA is connected in parallel to a switch controlled resistance-capacitance (RC) feedback circuit; and
    the second LNA is connected in parallel to another switch controlled RC feedback circuit.

11. The amplifying device according to claim 9, wherein the output of the first LNA and the output of the second LNA share a load in common.

12. A signal processing method based on an amplifying device, the method comprising:
    acquiring a signal;
    deciding whether the signal is a pre-amplified signal;
    attenuating and amplifying the signal to obtain an output signal if the signal is a pre-amplified signal; and
    amplifying the signal without being attenuated to obtain the output signal if the signal is not a pre-amplified signal.

13. The method according to claim 12, further comprising: dividing the output signal into two signals.

14. The method according to claim 13, wherein the dividing the output signal into two signals comprises:
    amplifying the output signal by two amplifiers (AMPs); and
    obtaining each of the two signals from an output of each of the two AMPs.

* * * * *

UNITED STATES PATENT AND TRADEMARK OFFICE
CERTIFICATE OF CORRECTION

PATENT NO. : 8,222,956 B2
APPLICATION NO. : 13/027959
DATED : July 17, 2012
INVENTOR(S) : Xinrong Hu et al.

It is certified that error appears in the above-identified patent and that said Letters Patent is hereby corrected as shown below:

In the Claims

Claim 6, Column 9, line 4, delete "claims" and insert -- claim 5 --.

Signed and Sealed this
Thirteenth Day of August, 2013

Teresa Stanek Rea
*Acting Director of the United States Patent and Trademark Office*